(12) United States Patent
Kye

(10) Patent No.: US 6,459,480 B1
(45) Date of Patent: Oct. 1, 2002

(54) MEASUREMENT METHOD OF ZERNIKE COMA ABERRATION COEFFICIENT

(75) Inventor: Jongwook Kye, Pleasanton, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 50 days.

(21) Appl. No.: 09/662,016

(22) Filed: Sep. 14, 2000

(51) Int. Cl.⁷ ................................................ G01B 9/00
(52) U.S. Cl. ........................................ 356/124; 355/53
(58) Field of Search ................................ 356/124, 125, 356/126, 127, 399, 400, 401; 355/53, 77, 63, 55, 67; 250/458; 430/30, 22

(56) References Cited

U.S. PATENT DOCUMENTS

| | | | |
|---|---|---|---|
| 5,615,006 A | * 3/1997 | Hirukawa et al. | 356/124 |
| 5,750,294 A | * 5/1998 | Hasegawa et al. | 430/22 |
| 5,814,425 A | * 9/1998 | Kataoka et al. | 430/30 |
| 6,011,611 A | * 1/2000 | Nomura et al. | 355/67 |
| 6,115,108 A | * 9/2000 | Capodieci | 355/77 |
| 6,130,747 A | * 10/2000 | Nomura et al. | 356/239.2 |
| 6,163,368 A | * 12/2000 | Hu | 355/55 |
| 6,327,023 B1 | * 12/2001 | Bukofsky et al. | 355/53 |

OTHER PUBLICATIONS

"Measurement of Wave–Front Aberrations in High–Resolution Optical Lithographic Systems from Printed Photoresist Patterns", Michael S. Yeung, IEEE Transactions on Semiconductor Manufacturing, vol. 13, No. 1, Feb. 2000.

"The Influence of Lens Aberrations in Lithorgraphy", Donis G. Flagello, Bernd Geh, Microlithography World, Winter 1998.

"Novel Aberration Monitor for Optical Lithography", P. Dirksen, C. Juffermans, et al., SPIE vol. 3679, Mar. 1999.

"Towards a Comprehensive Control of Full–Field Image Quality In Optical Photolithography", Donis Glagello, et al., ASM Lithography BV.

* cited by examiner

*Primary Examiner*—Hoa Q. Pham
(74) *Attorney, Agent, or Firm*—Sawyer Law Group LLP

(57) ABSTRACT

The present invention provides a method for measuring lens aberration of light on a wafer. The method includes printing a pattern on the wafer by projecting the pattern through a lens in a plurality of pitches and directions; measuring a plurality of critical dimension (CD) differences between two locations on the printed pattern for each of the plurality of pitches and directions; and determining at least one Zernike coma aberration coefficient based on the measured plurality of CD differences. The method in accordance with the present invention measures the CD difference between two locations on the printed pattern on a wafer. This CD difference is then used to calculate the Zernike coma aberration coefficients. No projected reference pattern is required to measure the CD difference, and thus an absolute coma aberration can be calculated. Also, the coma aberration coefficients are based on the light projected onto the wafer, allowing chip manufacturers to more precisely select a stepper with an appropriate lens aberration. This in turn allows better quality control in the clarity of patterns printed on wafers.

8 Claims, 6 Drawing Sheets

Mask Pattern
202

Wafer Printed
204

Printed Results

MEASUREMENT METHOD OF ZERNIKE COMA ABERRATION COEFFICIENT

FIELD OF THE INVENTION

The present invention relates to lens aberrations, and more particularly to the lens aberrations in lithography.

BACKGROUND OF THE INVENTION

Lithography, a well known process in the art, is often used to print patterns onto a silicon wafer. In lithography, a device called the "stepper" emits light through a lens. The light is then emitted through a patterned mask, projecting the pattern onto the wafer. The projected pattern is then printed onto the wafer. The clarity of the printed pattern depends upon the lens aberration. Because of the increasingly high density of devices on a single wafer, the clarity of the printed pattern is increasingly important. To properly control the clarity of the printed pattern, a chip manufacturer needs to have an accurate measurement of the aberration in the lens so that a stepper with an acceptable lens aberration is purchased.

Typically, the lens manufacturer, and the stepper manufacturer who installs the lens into its stepper, have calculated the lens aberration. Various conventional methods are used. Each of these methods use "Zernike polynomials". The Zernike polynomials are a set of equations which represent the effects of various types of lens aberrations. The sum of all of the Zernike polynomials give the total aberration of the lens. Each of the Zernike polynomials has a coefficient. By measuring the effects of the aberrations, one or more of the Zernike polynomial coefficients may be calculated. One type of aberrations is referred to as "coma". Coma results from unequal bending of parallel light rays from an off-axis object. The effects of coma is image asymmetry and pattern shift. The amount of image asymmetry is referred to as the "critical dimension", or "CD", difference. The CD difference is measured by a CD measuring (CDM) tool to determine the amount of asymmetry between two locations of a pattern projected through the lens. Zernike polynomials are well known in the art and will not be further described here.

Conventional methods used to calculate the aberration of lenses in steppers include measuring the wavefront deviation using an interferometer and measuring the relative phase shift of a projected pattern. However, the problem with the methods is they do not measure the lens aberration based on light on the wafer, i.e., they do not measure the "real" lens aberration from the pattern printed on the wafer. Also, for these conventional methods, a projected reference pattern is required to represent the "perfect" pattern. But since the reference pattern is projected, it is affected by lens aberrations as well. Thus, only a relative lens aberration can be measured. This does not provide the chip manufacturer with enough quality control over the printed patterns on a wafer.

Accordingly, there exists a need for a method for measuring lens aberration of light on a wafer. The method should not require a projected reference pattern. The present invention addresses such a need.

SUMMARY OF THE INVENTION

The present invention provides a method for measuring lens aberration of light on a wafer. The method includes printing a pattern on the wafer by projecting the pattern through a lens in a plurality of pitches and directions; measuring a plurality of critical dimension (CD) differences between two locations on the printed pattern for each of the plurality of pitches and directions; and determining at least one Zernike coma aberration coefficient based on the measured plurality of CD differences. The method in accordance with the present invention measures the CD difference between two locations on the printed pattern on a wafer. This CD difference is then used to calculate the Zernike coma aberration coefficients. No projected reference pattern is required to measure the CD difference, and thus an absolute coma aberration can be calculated. Also, the coma aberration coefficients are based on the light projected onto the wafer, allowing chip manufacturers to more precisely select a stepper with an appropriate lens aberration. This in turn allows better quality control in the clarity of patterns printed on wafers.

DETAILED DESCRIPTION

The present invention provides a method for measuring lens aberration of light on a wafer. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

The method for measuring lens aberration of light on a wafer in accordance with the present invention measures the critical dimension (CD) difference between two locations on the printed pattern on a wafer. This CD difference is then used to calculate the Zernike coma aberration coefficients. No projected reference pattern is required to measure the CD difference, and thus an absolute coma aberration can be calculated. Also, the coma aberration coefficients are based on the light projected onto the wafer, allowing chip manufacturers to more precisely select a stepper with an appropriate lens aberration. This in turn allows better quality control in the clarity of patterns printed on wafers.

To more particularly describe the features of the present invention, please refer to FIGS. 1 through 3D in conjunction with the discussion below.

Figure 1:
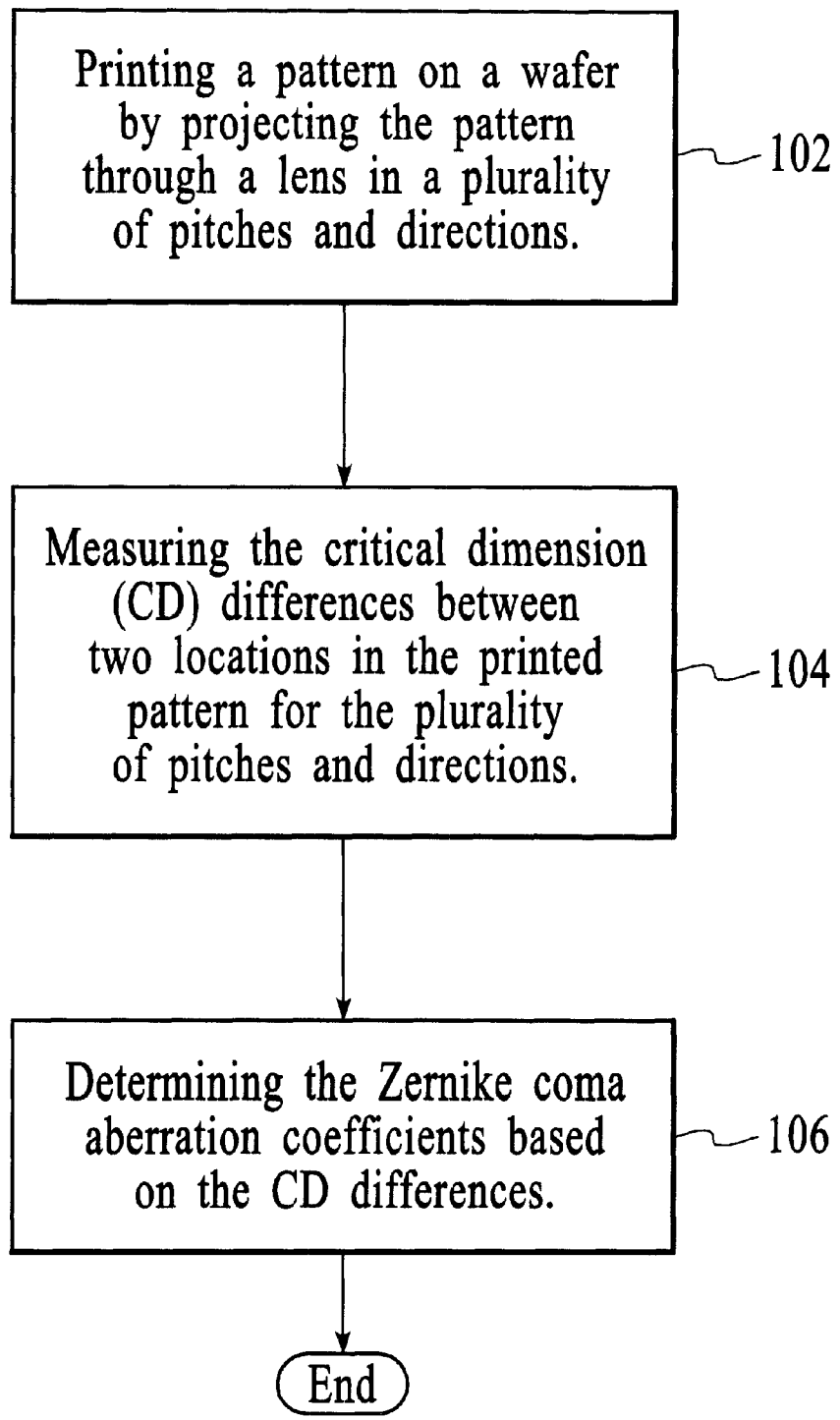
FIG. 1 is a flow chart illustrating a preferred embodiment of a method for measuring lens aberration of light on a wafer in accordance with the present invention.

FIG. 1 is a flow chart illustrating a preferred embodiment of a method for measuring lens aberration of light on a wafer in accordance with the present invention. First, a pattern is printed on a wafer by projecting the pattern through a lens in a plurality of pitches and directions, via step 102. Next, the CD differences between two locations in the printed pattern is measured for the plurality of pitches and directions, via step 104. Then, the Zernike coma aberration coefficients are determined based on the measured CD differences, via step 106.

Figure 2:
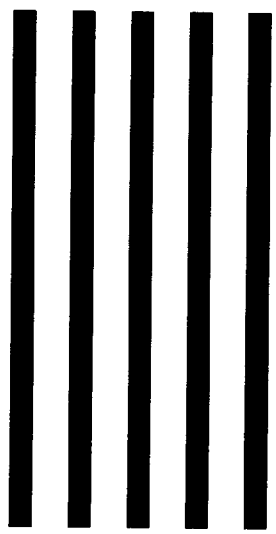
FIG. 2 illustrates sample patterns which may be provided on the wafer in accordance with the present invention.
Figure 2:
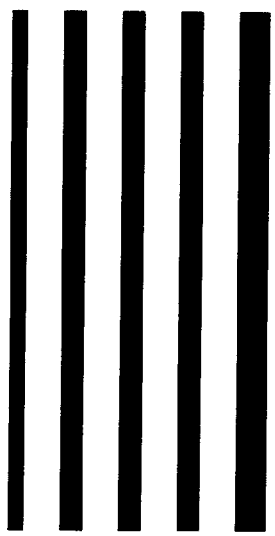

FIG. 2 illustrates sample patterns which may be provided on the wafer in accordance with the present invention. The mask pattern 202 is illustrated on top. This mask pattern 202 is projected onto the wafer, through the lens in the stepper. The resulting printed pattern 204 on the wafer is illustrated in the bottom pattern. Due to the effects of coma, the printed pattern 204 has a pattern shift and CD asymmetry. In this example, the printed pattern 204 is shifted to the left as compared to the mask pattern 202, while the dimension between a left and a right location in the printed pattern 204 is different from the same two locations in the mask pattern 202.

Referring to both FIGS. 1 and 2, according to the present invention, the mask pattern 202 is projected onto the wafer in different pitches and directions, via step 102. The printed pattern 204 results for each pitch and direction. The CD difference between any two locations in the printed pattern 204 is measured for each pitch and direction, via step 104. For example, the CD difference can be measured between line 1 (L1) and line 5 (L5) of the printed pattern 204. From these CD differences, the Zernike coma aberration coefficients can be calculated, via step 106.

Figure 3A:
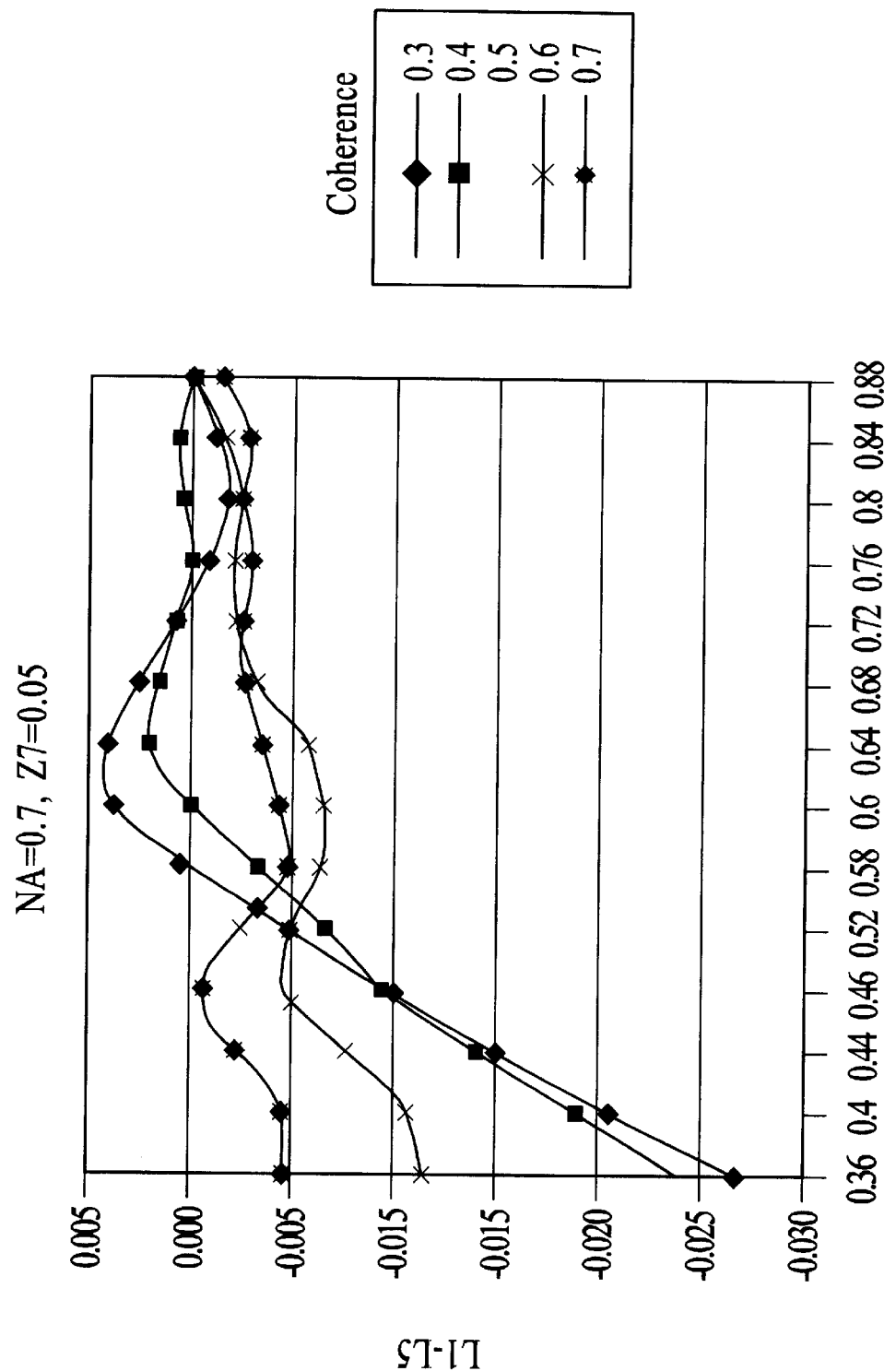
FIGS. 3A through 3D illustrate sample pitch versus CD difference graphs used to measure the lens aberration of light on a wafer in accordance with the present invention.

To determine the coma aberration coefficients, via step 106, the CD differences are plotted on a graph versus the pitches, with different coherence values. FIGS. 3A through 3D illustrate sample pitch versus CD difference graphs used to measure the lens aberration of light on a wafer in accordance with the present invention. The CD differences versus pitches graph create a profile. The profile may then be matched to a known profile for a Zernike coma aberration coefficient, thus identifying the value of the coefficient. For example, FIG. 3A provides a value for the Zernike coma aberration coefficient Z7.

Figure 3B:
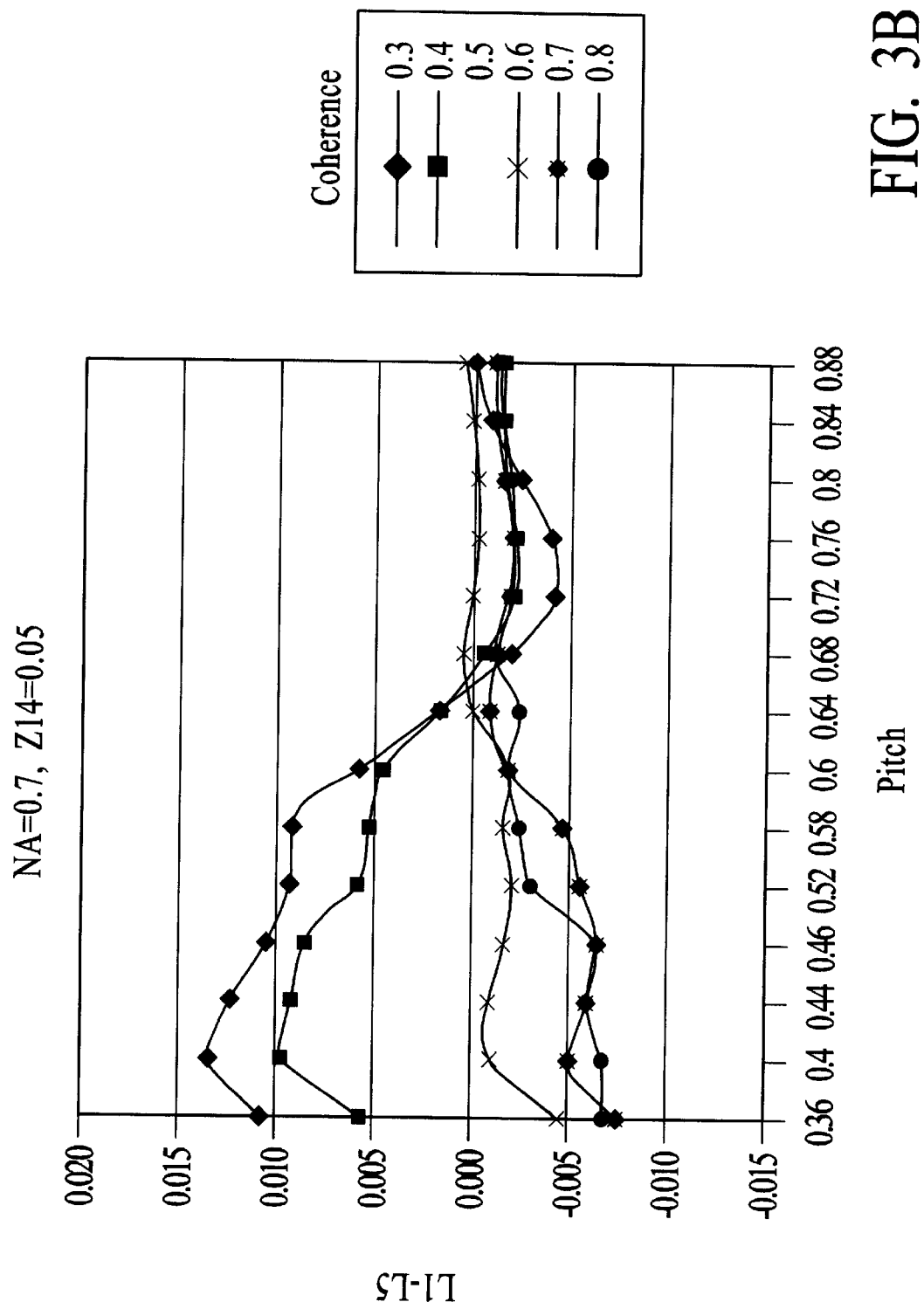
Figure 3C:
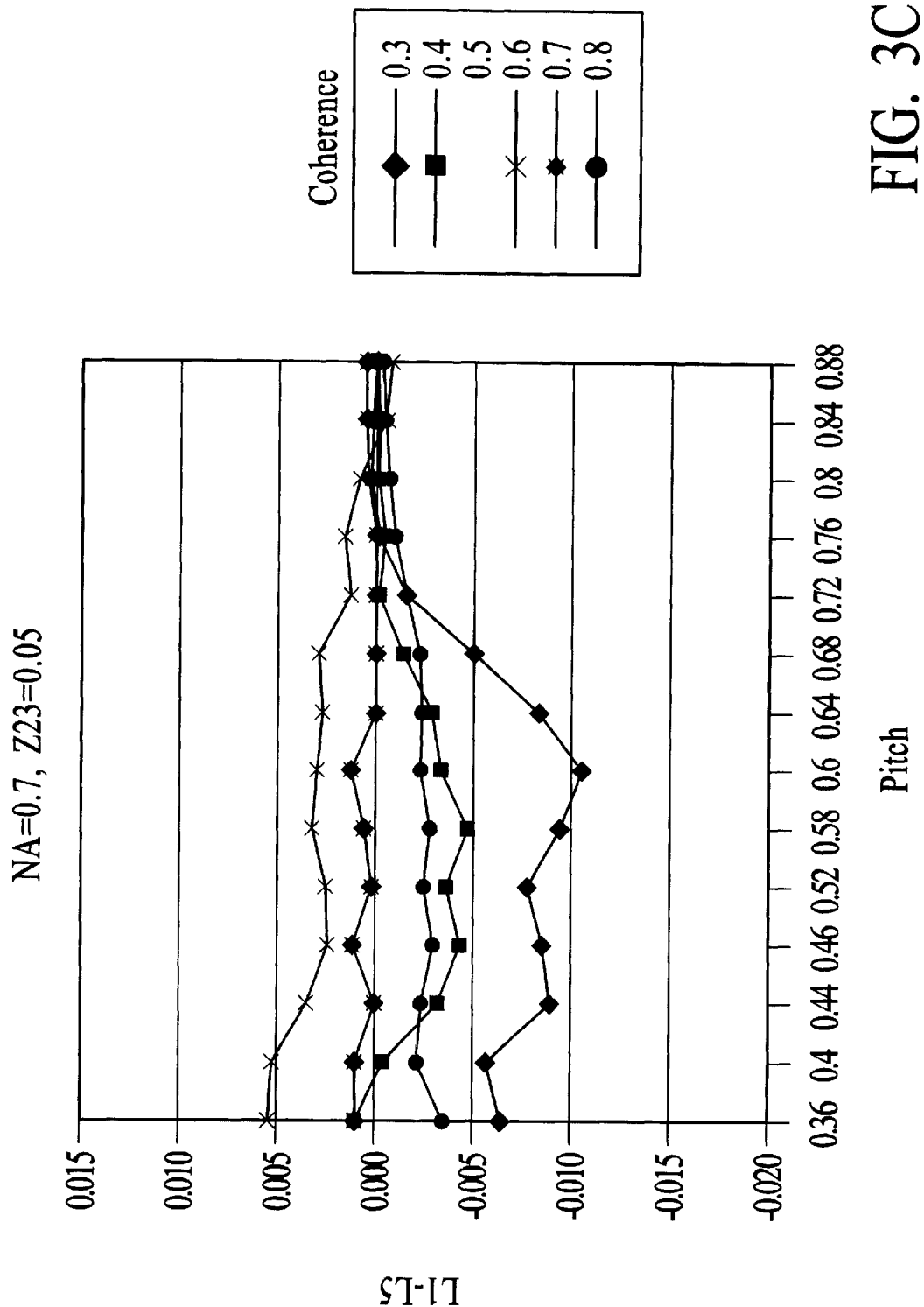
Figure 3D:
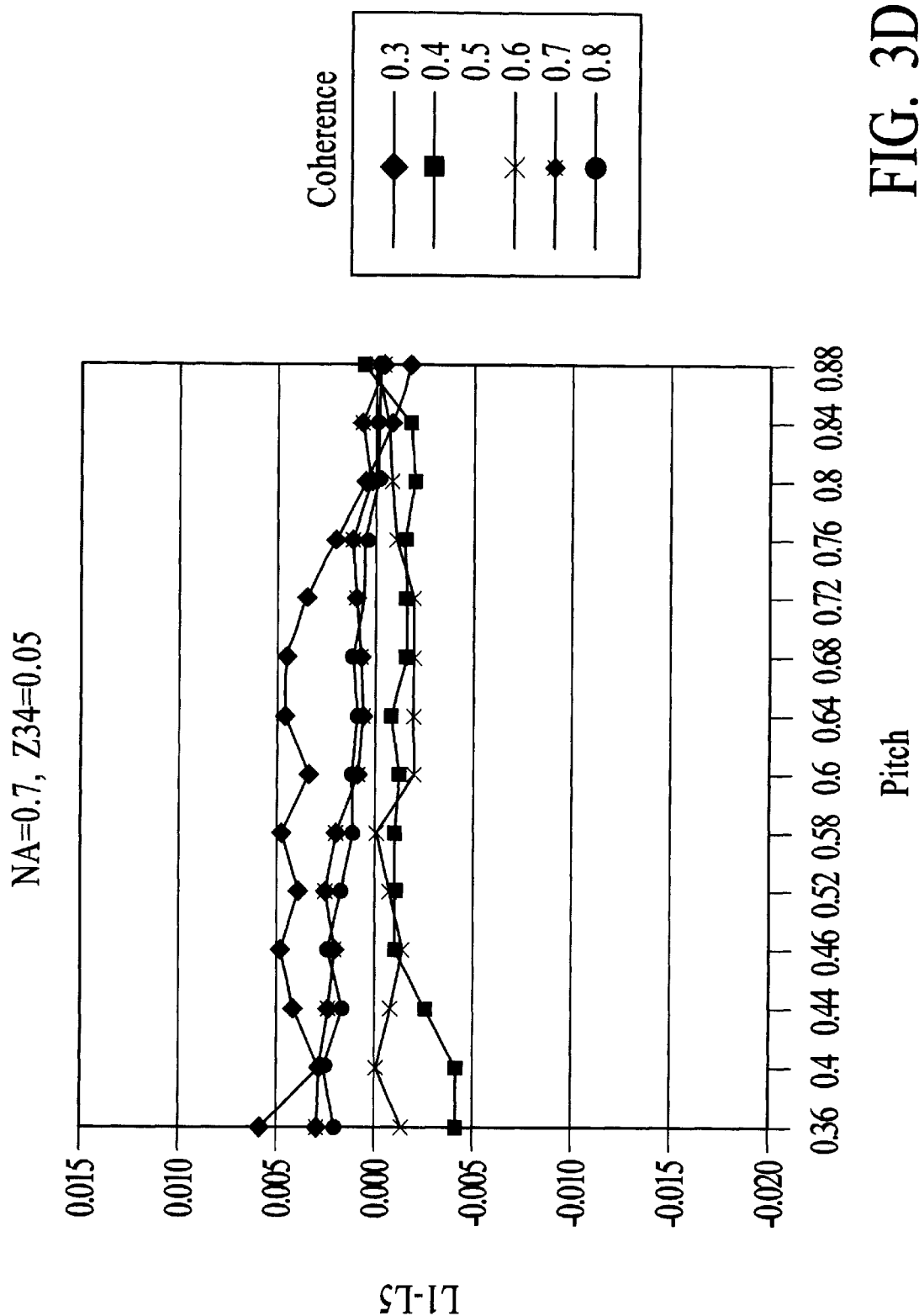

Steps 102 through 106 are repeated by printing a pattern in a plurality of pitches and directions on different locations on the wafer. This leads to more pitches versus CD difference graphs. Each of these graphs can be matched to another known profile for a Zernike coma aberration coefficient, thus identifying the values of these coefficients. For example, FIGS. 3B through 3D provides values for the Zernike coma aberration coefficients Z14, Z23, and Z34. In this manner, the lens aberration of light on the wafer is measured.

Sometimes the lens aberration of light on the wafer is such that a chip manufactured on the wafer with the lens under a set of standard design rules will not meet the manufacturer's specifications. In this case, the measured CD differences may be used to create special design rules so that the stepper with the lens may still be used by the manufacturer to provide chips which meet the specifications.

A method for measuring lens aberration of light on a wafer has been disclosed. The method in accordance with the present invention measures the critical dimension (CD) difference between two locations on the printed pattern on a wafer. This CD difference is then used to calculate the Zernike coma aberration coefficients. No projected reference pattern is required to measure the CD difference, and thus an absolute coma aberration can be calculated. Also, the coma aberration coefficients are based on the light projected onto the wafer, allowing chip manufacturers to more precisely select a stepper with an appropriate lens aberration. This in turn allows better quality control in the clarity of patterns printed on wafers.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for measuring lens aberration of light on a wafer, comprising the steps of:
   (a) printing only one pattern on the wafer by projecting the pattern through a lens in a plurality of pitches and directions;
   (b) measuring a plurality of critical dimension (CD) differences between two locations on the printed pattern for each of the plurality of pitches and directions; and
   (c) determining at least one Zernike coma aberration coefficient based on the measured plurality of CD differences.

2. The method of claim 1, wherein the printing step (a) comprises:
   (a1) providing only one mask pattern;
   (a2) projecting the mask pattern onto the wafer through the lens in the plurality of pitches and directions; and
   (a3) printing the projected mask pattern onto the wafer.

3. The method of claim 1, wherein the determining step (c) comprising:
   (c1) creating a graph of the plurality of pitches versus the plurality of measured CD differences;
   (c2) matching a profile of the graph with a profile for a Zernike coma aberration coefficient; and
   (c3) determining a value for the coma aberration coefficient.

4. The method of claim 1, further comprising:
   (d) creating a set of special design rules for a manufacturing of a chip on the wafer in accordance with the measured plurality of CD differences.

5. A method for measuring lens aberration of light on a wafer, comprising the steps of:
   (a) printing only one pattern on the wafer by projecting the pattern through a lens in a plurality of pitches and directions;
   (b) measuring a plurality of CD differences between two locations on the printed pattern for each of the plurality of pitches and directions;
   (c) creating a graph of the plurality of pitches bersus the plurality of measured CD differences;
   (d) matching a profile of the graph with a profile for a Zernike coma aberration coefficient; and
   (e) determining a value for the coma aberration coefficient.

6. The method of claim 5, wherein the printing stip (a) comprises:
   (a1) providing only one mask pattern;

(a2) projecting the mask pattern onto the wafer through the lens in the plurality of pitched and directions; and (a3) printing the projected mask pattern onto the wafer.

7. The method of claim 5, further comprising:

(f) creating a set of special design rules for a manufacturing of a chip on the wafer in accordance with the measured plurality of CD differences.

8. A method for measuring lens aberration of light on a wafer, comprising the steps of:

(a) providing only one mask pattern;

(b) projecting the mask pattern onto the wafer through a lens in a plurality of pitches and directions;

(c) printing the projected mask pattern onto the wafer;

(d) measuring a plurality of CD differences between two locations on the printed pattern for each of the plurality of pitches and directions;

(e) creating a graph of the plurality of pitches versus the plurality of measured CD differences;

(f) matching a profile of the graph with a profile for a Zernike coma aberration coefficient; and (g) determining a value for the coma aberration coefficient.

* * * * *